United States Patent
Xu et al.

(10) Patent No.: US 10,356,941 B2
(45) Date of Patent: Jul. 16, 2019

(54) AIR-COOLING HEAT DISSIPATION DEVICE

(71) Applicant: Microjet Technology Co., Ltd., Hsinchu (TW)

(72) Inventors: Zhen-Chun Xu, Hsinchu (TW); Kuei-Liang Chiang, Hsinchu (TW); Yung-Kang Lin, Hsinchu (TW); Chi-Feng Huang, Hsinchu (TW); Yung-Lung Han, Hsinchu (TW)

(73) Assignee: MICROJET TECHNOLOGY CO., LTD., Hsinchu (CN)

( * ) Notice: Subject to any disclaimer, the term of this patent is extended or adjusted under 35 U.S.C. 154(b) by 0 days.

(21) Appl. No.: 15/834,916

(22) Filed: Dec. 7, 2017

(65) Prior Publication Data
US 2018/0168066 A1   Jun. 14, 2018

(30) Foreign Application Priority Data
Dec. 8, 2016 (TW) .............................. 105140695 A

(51) Int. Cl.
*H05K 7/20* (2006.01)
*H01L 23/467* (2006.01)
(Continued)

(52) U.S. Cl.
CPC ....... *H05K 7/20145* (2013.01); *F04B 17/003* (2013.01); *F04B 35/04* (2013.01);
(Continued)

(58) Field of Classification Search
CPC ........... H05K 7/20154; H05K 7/20272; H05K 7/20909; H05K 7/20918; H05K 7/20263;
(Continued)

(56) References Cited

U.S. PATENT DOCUMENTS

| | | | |
|---|---|---|---|
| 2008/0062644 A1* | 3/2008 | Petroski | F04D 33/00 361/695 |
| 2009/0009964 A1* | 1/2009 | Suzuki | H01L 23/467 361/692 |

(Continued)

FOREIGN PATENT DOCUMENTS

| | | |
|---|---|---|
| TW | M525446 U | 7/2016 |
| TW | I544865 B | 8/2016 |
| TW | M529698 U | 10/2016 |

*Primary Examiner* — Adam B Dravininkas
(74) *Attorney, Agent, or Firm* — Kirton McConkie; Evan R. Witt

(57) ABSTRACT

An air-cooling heat dissipation device includes a base, a swirling-airflow heatsink, an air pump and a passage connector. The base is located beside an electronic component while the air pump is fixed on the base. The swirling-airflow heatsink is attached on the electronic component and includes a swirling passage defined by a conductive line and a thermal conduction plate collaboratively. An airflow-guiding chamber is defined by the air pump and the base collaboratively, and the airflow-guiding chamber is in communication with the swirling passage by the passage connector. When the air pump is enabled, an ambient air is introduced into the airflow-guiding chamber of the base and transferred to the swirling passage of the swirling-airflow heatsink through a discharge opening of the base and the passage connector. Consequently, a fast swirling air flow is produced to cool the electronic component.

10 Claims, 14 Drawing Sheets

(51) Int. Cl.
*F04B 45/047* (2006.01)
*F04B 17/00* (2006.01)
*F04B 35/04* (2006.01)
*G06F 1/20* (2006.01)
*H01L 23/34* (2006.01)

(52) U.S. Cl.
CPC ............ *F04B 45/047* (2013.01); *G06F 1/203* (2013.01); *H01L 23/34* (2013.01); *H01L 23/467* (2013.01); *H05K 7/2039* (2013.01); *H05K 7/20154* (2013.01); *H05K 7/20172* (2013.01); *H05K 7/20945* (2013.01)

(58) Field of Classification Search
CPC ........... H05K 7/20836; H05K 7/20145; H05K 7/20254; H05K 7/20336; F04B 17/003; F04B 45/047
See application file for complete search history.

(56) References Cited

U.S. PATENT DOCUMENTS

| | | | |
|---|---|---|---|
| 2009/0219686 A1* | 9/2009 | Ishikawa | F04F 7/00 361/692 |
| 2011/0174470 A1* | 7/2011 | Chang | F28D 7/04 165/163 |
| 2016/0076530 A1* | 3/2016 | Chen | F04B 45/047 417/413.2 |

* cited by examiner

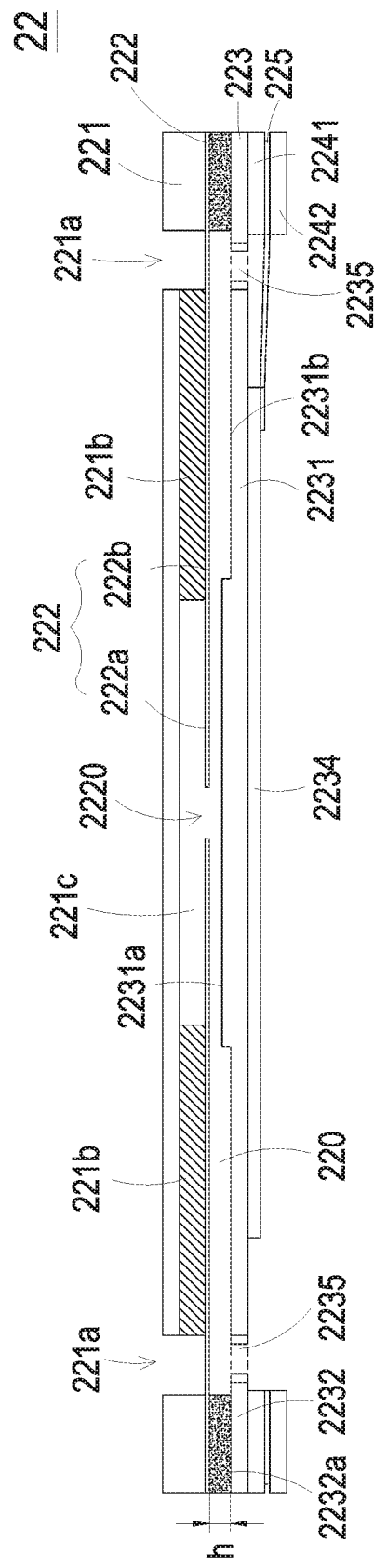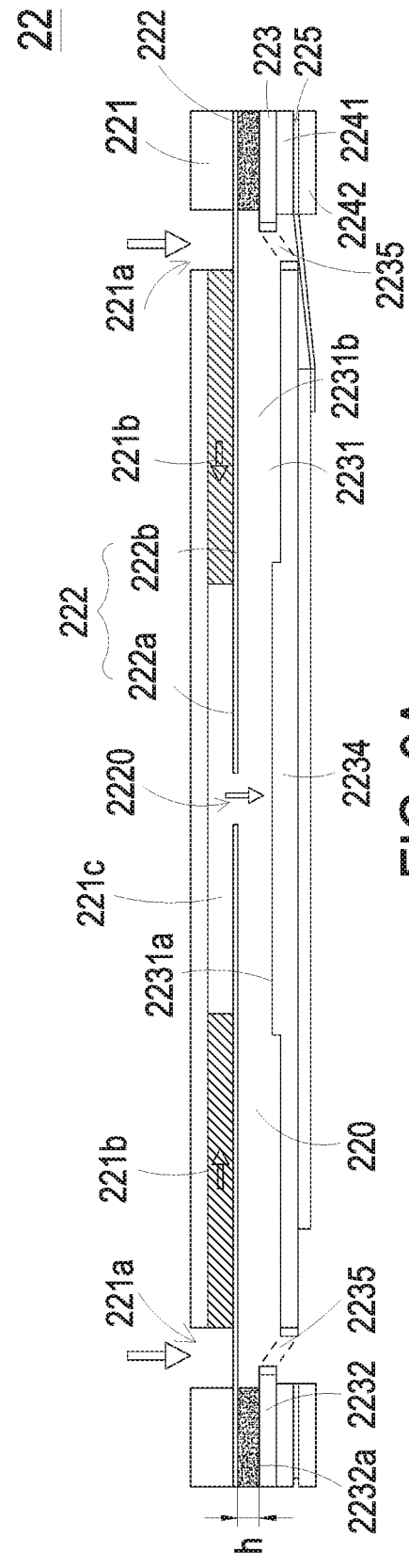
FIG. 8
FIG. 9A

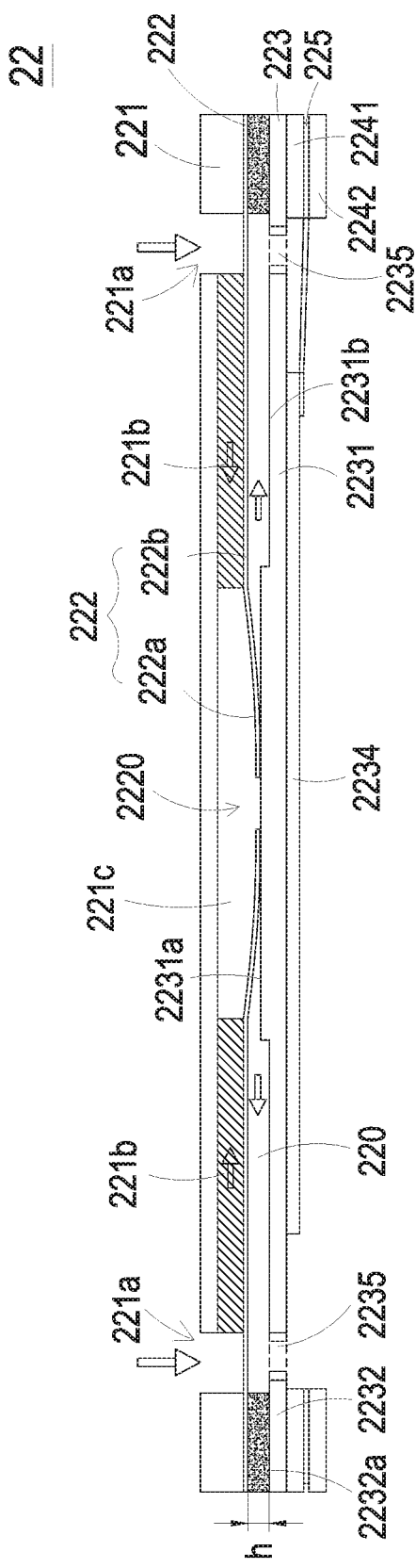
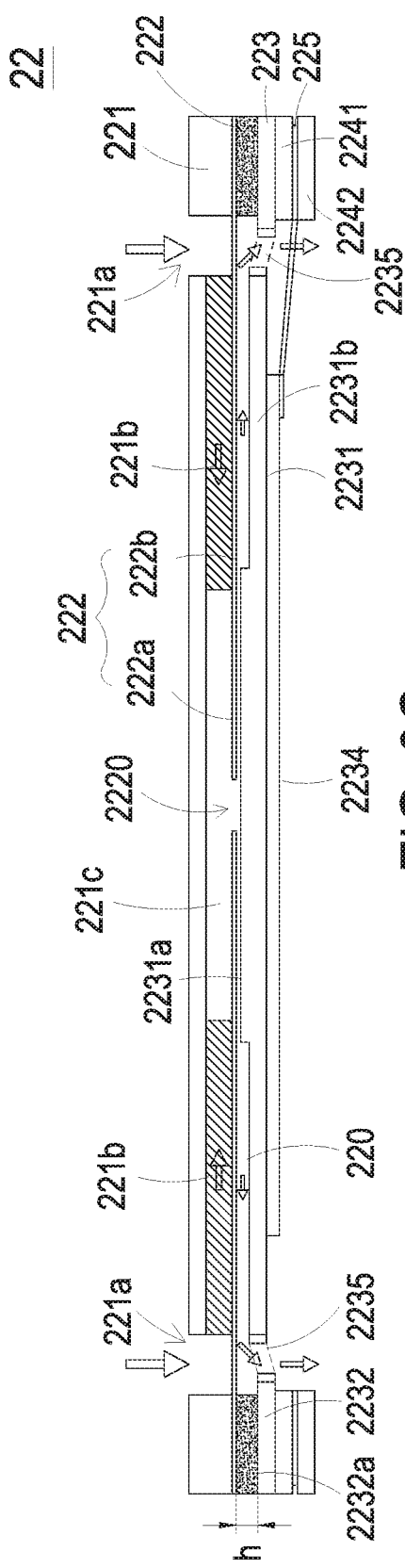
FIG. 9B
FIG. 9C

AIR-COOLING HEAT DISSIPATION DEVICE

FIELD OF THE INVENTION

The present invention relates to an air-cooling heat dissipation device, and more particularly to an air-cooling heat dissipation device using an air pump to produce an air flow to remove heat.

BACKGROUND OF THE INVENTION

With increasing development of science and technology, the trends of designing electronic devices such as portable computers, tablet computers, industrial computers, portable communication devices or video players are designed toward minimization, easy portability and high performance. Generally, the limited space inside the electronic device is equipped with various high-integration or high-power electronic components for increasing the computing speed and the function of the electronic device, thus generating a great deal of heat during operations. Consequently, the temperature inside the device is increased and high temperature is harmful to the components. Since the electronic device is usually designed as possible as in slim, flat and succinct appearance, it has insufficient inner space for dissipating the waste heat. In case that the heat is not effectively dissipated away, the electronic components of the electronic device are adversely affected by the heat and the high temperature may result in the interference of operation or damaged of the device.

Generally, there are two types of the heat-dissipating mechanisms used in the electronic device to solve such problem, which are known as active heat-dissipating mechanism and passive heat-dissipating mechanism. The active heat-dissipating mechanism is usually presented as an axial fan or a blower, disposed within the electronic device, which can generate an air flow through the space inside the electronic device that dissipating the waste heat. However, the axial fan and the blower are noisy during operation. In addition, they are bulky and have short life span and not suitable to be used in the small-sized, portable electronic device.

On the other hand, electronic components are generally fixed on a printed circuit board (PCB) by means of surface mount technology (SMT) or selective soldering technology. The electronic components would readily come off from the PCB board due to exposure of high temperature. Moreover, most electronic components would be damaged by high temperature. In other words, high temperature not only impairs the stability of performance of the electronic components, but also shortens the life span of the electronic components.

FIG. 1 is a schematic view illustrating a conventional heat-dissipating mechanism as the passive heat-dissipating mechanism. As shown in FIG. 1, the conventional heat-dissipating mechanism 1 provides a thermal conduction plate 12 attaching on a surface of an electronic component 11 by thermal adhesive 13. Therefore, the thermal adhesive 13 and the thermal conduction plate 12 form a thermal conduction path by which the waste heat generated by the electronic component 11 can be conducted away and then dissipated by convection. However, the heat dissipating efficiency of the conventional heat-dissipating mechanism 1 is usually insufficient, and thus the applications of the conventional heat-dissipating mechanism 1 are limited.

Therefore, there is a need of providing an air-cooling heat dissipation device with improved performance as well as compact size to substitute the conventional technologies.

SUMMARY OF THE INVENTION

An object of the present invention provides an air-cooling heat dissipation device, which is applied to an electronic device to remove heat generated by a heat source of the electronic device through a swirling air flow. The use of the air-cooling heat dissipation device can increase the heat dissipating efficiency and prevent generating unacceptable noise. Consequently, the performance of the electronic components of the electronic device is stabilized, and the life spans of the electronic components are extended.

Another object of the present invention provides an air-cooling heat dissipation device with a temperature controlling function. The operations of an air pump are controlled according to the temperature change of the heat source of the electronic device. Consequently, the life span of the air pump is extended.

In accordance with an aspect of the present invention, an air-cooling heat dissipation device is provided for removing heat from an electronic component. The air-cooling heat dissipation device includes a base, a swirling-airflow heatsink, an air pump and a passage connector. The air pump is fixed on an introduction opening of the base, sealing the edge of the introduction opening so that an airflow-guiding chamber is formed in the base. The passage connector is coupled with a discharge opening of the base and in communication with the airflow-guiding chamber. Therefore, the base, the air pump and the passage connector are assembled to be an air input assembly. The swirling-airflow heatsink may include a swirl-shaped conductive line and a thermal conduction plate which is placed over the conductive line so as to form a swirling passage therebetween. The thermal conduction plate has a vent at the location corresponding to a middle region of the swirling passage. The swirling-airflow heatsink may be directly attached on the electronic component, or there is a thermal conduction element inserted into therebetween. The air input assembly is located beside the electronic component and communicates with the swirling passage through the passage connector. Therefore, when the air pump is enabled, an ambient air is driven by the air pump and introduced into the airflow-guiding chamber of the base and transferred to the swirling passage of the swirling-airflow heatsink through the passage connector, so that a fast swirling air flow is produced and flows through the heat source. Hence, the heat from the electronic component is directly removed, or is transferred to the thermal conduction element and then being removed, after which the heated air flow is discharged through the vent of the swirling-airflow heatsink.

In accordance with another aspect of the present invention, an air-cooling heat dissipation device may include two air input assemblies and a swirling-airflow heatsink. Each air input assembly may be composed of a base, an air pump fixed on an introduction opening of the base, and a passage connector coupled with a discharge opening of the base. The swirling-airflow heatsink may include two swirl-shaped conductive lines and a thermal conduction plate, wherein the thermal conduction plate is placed over the two conductive lines so as to form a dual-swirling passage therebetween. The dual-swirling passage includes two swirling passages each of which has a middle region, and the thermal conduction plate has a vent at the location corresponding to the middle regions of the swirling passages. The swirling-airflow heatsink may be directly attached on the electronic component, or there is a thermal conduction element inserted into therebetween. The two air input assemblies are opposed to each other with respect to the electronic component, while their passage connectors are in communication with the two swirling passages of the dual-swirling passage respectively. Therefore, when the air pumps of the two air input assemblies are enabled, in each air input assembly, an ambient air is driven by the air pump and introduced into the airflow-guiding chamber of the base and transferred to the corresponding swirling passage of the swirling-airflow heatsink through the passage connector. Hence, a fast dual-swirling air flow is produced and flows through the heat source. As a result, the heat from the electronic component is directly removed, or is transferred to the thermal conduction element and then being removed, after which the heated air flow is discharged through the vent of the swirling-airflow heatsink.

The above contents of the present invention will become more readily apparent to those ordinarily skilled in the art after reviewing the following detailed description and accompanying drawings, in which:

BRIEF DESCRIPTION OF THE DRAWINGS

FIG. 8 is a schematic cross-sectional view illustrating the air pump as shown in FIGS. 6A and 6B;

FIGS. 9A to 9E schematically illustrate the actions of the air pump of FIGS. 6A and 6B;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
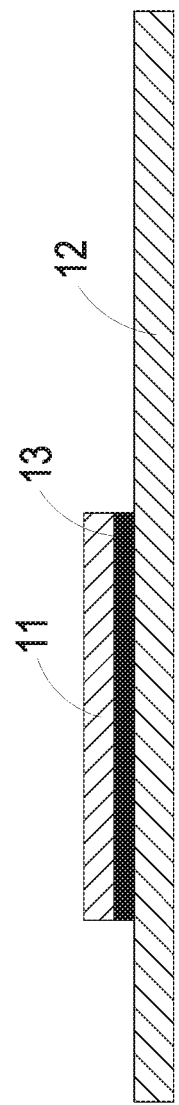
FIG. 1 is a schematic view illustrating a conventional heat-dissipating mechanism.
Figure 2:
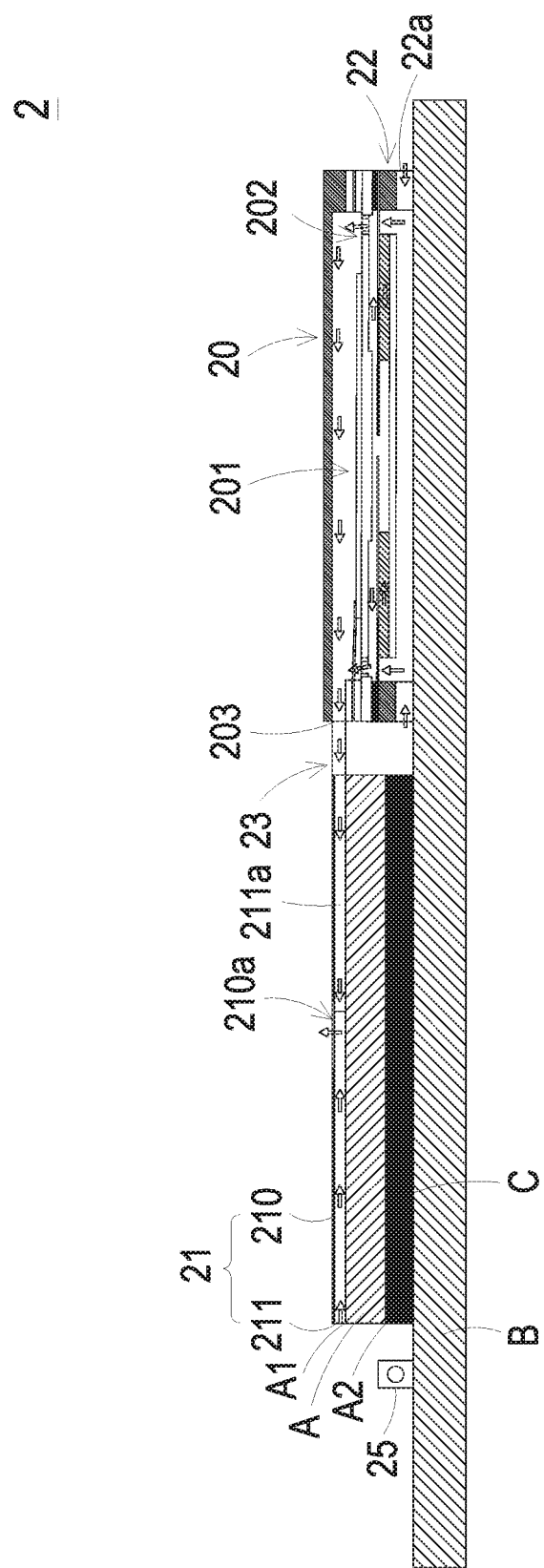
FIG. 2 is a schematic cross-sectional view illustrating the structure of an air-cooling heat dissipation device according to a first embodiment of the present invention.

FIG. 2 is a schematic cross-sectional view illustrating the structure of an air-cooling heat dissipation device according to a first embodiment of the present invention. The air-cooling heat dissipation device 2 is applied to an electronic device to remove the heat generated by a heat source of the electronic device. An example of the electronic device includes but is not limited to a portable computer, tablet computer, an industrial computer, a portable communication device or video player. In this embodiment, the heat source is an electronic component A. The electronic component A may be attached on a thermal conductive member (e.g., a thermal conduction plate B) through a thermal conductive medium (e.g., a thermal adhesive C). Consequently, the heat generated by the electronic component A is transferred to the thermal conduction plate B and dissipated away.

The heat generated by the electronic component A can be further dissipated away by heat convection caused by the air-cooling heat dissipation device 2. In some embodiments, the air-cooling heat dissipation device 2 comprises a base 20, a swirling-airflow heatsink 21, an air pump 22 and a passage connector 23. The base 20 is located beside the electronic component A, having an introduction opening 202 on the bottom side and a discharge opening 203 formed on the lateral side. The swirling-airflow heatsink 21 is attached on a top surface of the electronic component A, comprising a thermal conductive plate 210 and a conductive line 211. The conductive line 211 has a swirl shape, and the thermal conductive plate 210 is placed on the conductive line 211, so that a swirling passage 211a is formed between the thermal conduction plate 210 and the conductive line 211. Moreover, the thermal conduction plate 210 has a vent 210a, the location of which is corresponding to and substantially aligned with a middle region 211b of the swirling passage 211a (see FIG. 3). The air pump 22 is fixed on the introduction opening 202 of the base 20 as sealing the edge of the introduction opening 202. Therefore, an airflow-guiding chamber 201 is formed between the air pump 22 and the base 20. The passage connector 23 is connected between the discharge opening 203 of the base 20 and the swirling passage 211a of the swirling-airflow heatsink 21 so as to provide access therebetween. When the air pump 22 is enabled, the ambient air outside the air-cooling heat dissipation device 2 is introduced into the airflow-guiding chamber 201 of the base 20 through the introduction opening 202. Afterwards, through the discharge opening 203 and the passage connector 23, the air is introduced into the swirling passage 211a of the swirling-airflow heatsink 21. Consequently, a fast swirling air flow is generated and removes heat from the electronic component A, after which the heated air flow is discharged to the exterior surroundings through the vent 210a of the swirling-airflow heatsink 21. As a result, the waste heat generated by the electronic component A is dissipated away.

In some embodiments, the base 20 has a frame structure in a size substantially matching the size of the air pump 22, and the air pump 22 is fitted to and coupled with the bottom side of the base 20 as sealing the edge of the introduction opening 202. Consequently, the airflow-guiding chamber 201 is defined by the base 20 and the air pump 22 collaboratively. Preferably but not exclusively, the passage connector 23 is a pipe, a first end of which is in communication with the discharge opening 203 of the base 20, and a second end of which is in communication with an input part 211c (shown in FIG. 3) of the swirling passage 211a of the swirling-airflow heatsink 21. When the air pump 22 is enabled, the air flow is driven by the air pump 22, moving from the base 20 to the swirling passage 211a of the swirling-airflow heatsink 21 through the passage connector 23. In duration of flowing in the swirling passage 211a, the air flow exchanges heat with the electronic component A thus removing heat from it. In an embodiment, a second surface A2 of the electronic component A is attached on the thermal conduction plate B through thermal adhesive C, so that the heat can be dissipated passively along a thermal conductive path via the thermal conduction plate B. The air pump 22 may also be disposed on the thermal conduction plate B. The thermal conduction plate B is made of a material with high thermal conductivity such as artificial graphite.

According to the first embodiment of the present invention, the air pump 22 is a piezoelectric air pump. Once the piezoelectric air pump is activated, the ambient air outside the air-cooling heat dissipation device 2 is introduced into the air pump 22 through the pump entrances 22a, which are formed on the lateral walls of the air pump 22. The piezoelectric actuation of the air pump 22 produces a certain pressure that facilitates fast flow of the air from the introduction opening 202 to the airflow-guiding chamber 201. The air flow is then discharged to the passage connector 23 through the discharge opening 203. Through the passage connector 23, the air flow is introduced into the swirling passage 211a of the swirling-airflow heatsink 21, and a fast swirling air flow is consequently formed. The fast swirling air flow passes along the swirling passage 211a as flowing through the top surface of the electronic component A, thus heat exchange therebetween occurs. After being heated, the fast swirling air flow is discharged to the exterior surroundings of the air-cooling heat dissipation device 2 through the vent 210a of the swirling-airflow heatsink 21. As shown in FIG. 2, during the operation of the air pump 22, the cold air outside is continuously driven by the air pump 22 and guided into the air-cooling heat dissipation device 2, which continuously produces the fast swirling air flow to cool the electronic component A. Such disposition can facilitate circulative heat convection in the air-cooling heat dissipation device 2 that effectively dissipates waste heat away. Therefore, high temperature of or around the electronic component A is prevented, and the life span and stability of performance of the electronic component A are increased.

Figure 3:
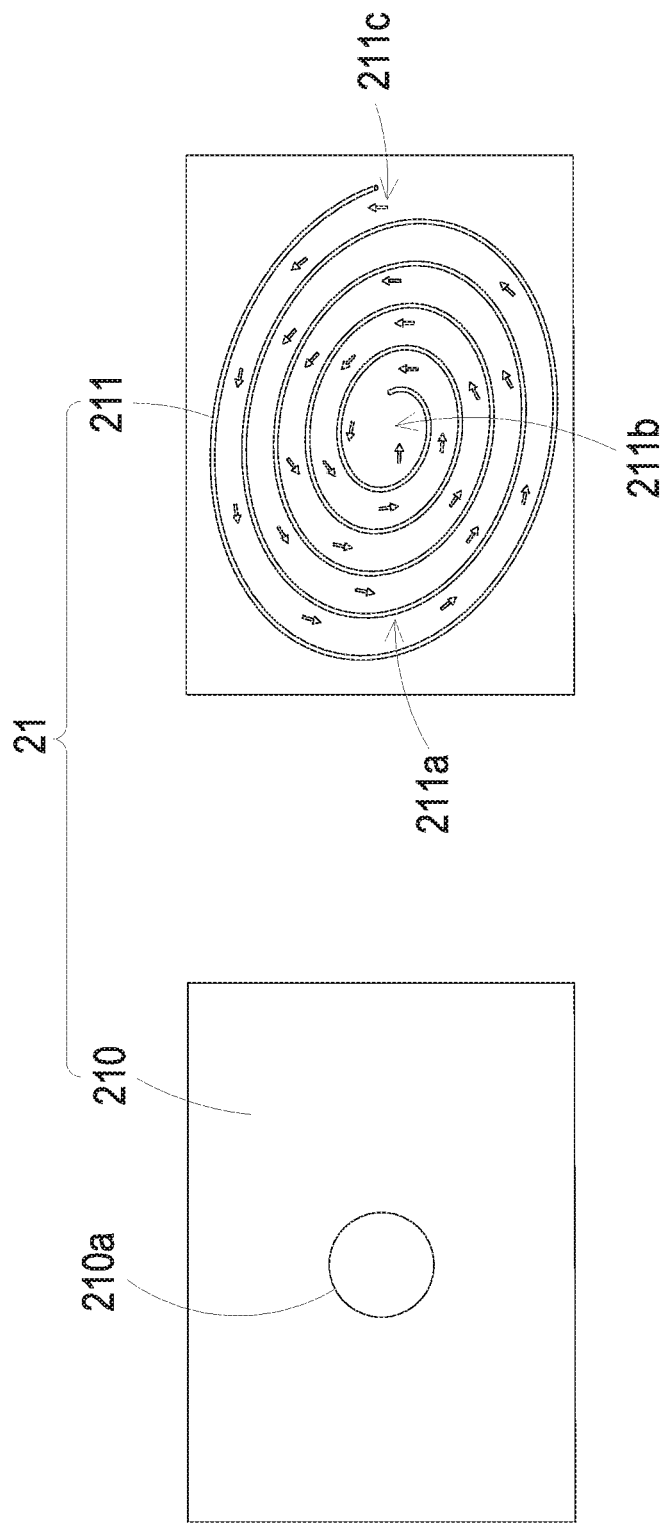
FIG. 3 is a schematic exploded view illustrating the swirling-airflow heatsink of the air-cooling heat dissipation device according to the first embodiment of the present invention.

Please refer to FIGS. 2 and 3. FIG. 3 is a schematic exploded view illustrating the swirling-airflow heatsink of the air-cooling heat dissipation device according to the first embodiment of the present invention. As shown in FIG. 3, the swirling-airflow heatsink 21 comprises the thermal conduction plate 210 and the conductive line 211. The thermal conduction plate 210 has a vent 210a in the center for discharging the fast swirling air flow. The conductive line 211 is curved to a shape of swirl and attached to the thermal conduction plate 210. Consequently, the swirling passage 211a is defined by the thermal conduction plate 210 and the conductive line 211. The swirling passage 211a comprises an input part 211c and a middle region 211b, wherein the input part 211c is in communication with the passage connector 23, and the middle region 211b is aligned with the vent 210a of the thermal conduction plate 210.

For assembling the swirling-airflow heatsink 21, firstly, the conductive line 211 is made by a conductive wire wound to have the swirl shape and then the conductive line 211 is attached on a first surface A1 of the electronic component A. Then, the thermal conduction plate 210 is placed over the swirl-shaped conductive line 211 to lie on a top portion of the conductive line 211. That is, every two adjacent segments of the swirling passage 211a are separated from each other through the diameter of the conductive line 211. Meanwhile, the top side of the swirling passage 211a is covered and sealed by the thermal conduction plate 210. Consequently, the swirling-airflow heatsink 21 is produced. Such manufacture process is very simple and easily applicable. Moreover, the diameter of the conductive line 211 and the thickness of the thermal conduction plate 210 can be selected to fit in the vertical height of the inner space within the casing of the electronic device.

After the air pushed by the air pump 22 is guided by the passage connector 23 to the input part 211c of the swirling-airflow heatsink 21, the air is guided and restricted by the swirling passage 211a to move along a swirling direction, and consequently forms the fast swirling airflow. Since the fast swirling airflow is directly contacted with the first surface A1 of the electronic component A, the fast swirling airflow can effectively remove the heat generated by the electronic component A. The heated air flow is discharged through the vent 210a of the thermal conduction plate 210 from the middle region 211b of the swirling passage 211a.

Preferably but not exclusively, the conductive line 211 and the thermal conduction plate 210 are made of a metallic material such as copper. In an embodiment, the thermal conduction plate 210 is a slim-type thermal conduction plate 210. Preferably, the thickness of the thermal conduction plate 210 is 1 mm, and the diameter of the conductive line 211 is 2 mm. Due to the thickness of the thermal conduction plate 210 and the diameter of the conductive line 211, the overall height of the swirling-airflow heatsink 21 is 3 mm. The slim-type swirling-airflow heatsink 21 is suitably used in the slim-type and small-size electronic device. It is noted that the thickness of the thermal conduction base and the diameter of the conductive line may be varied according to the practical requirements.

Figure 4:
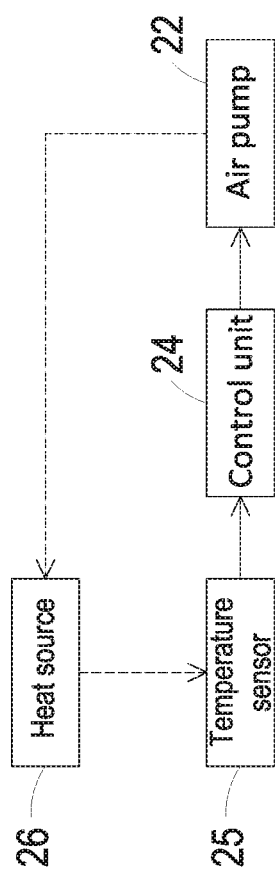
FIG. 4 is a schematic block diagram illustrating a control system for the air-cooling heat dissipation device according to the first embodiment of the present invention.

Please refer to FIG. 2 and FIG. 4. FIG. 4 is a schematic block diagram illustrating a control system for the air-cooling heat dissipation device according to the first embodiment of the present invention. As shown, the control system comprises a control unit 24 and a temperature sensor 25. The control unit 24 is electrically connected with the air pump 22 to control the operation of the air pump 22. An example of the heat source 26 includes but is not limited to the electronic component A, the thermal conduction plate B or any other heat generation element. In case that the heat source 26 is the electronic component A, the temperature sensor 25 may be located near the electronic component A so as to detect the ambient temperature of the electronic component A. Alternatively, the temperature sensor 25 may be directly attached on the electronic component A so as to detect the temperature thereof. The temperature sensor 25 is electrically connected with the control unit 24 to which the detected temperature as a detecting signal is transmitted. After receiving the detecting signal, the control unit 211 determines whether the detected temperature is higher than a pre-determined threshold value. If the detected temperature is determined higher than or equal to the threshold value, the control unit 211 enables the air pump 22; oppositely, if the detected temperature is determined lower than the threshold value, the control unit 211 disables the air pump 22. As so, the air pump 22 operates only when high temperature is detected, thus the life span of the air pump 22 can be prolonged.

Figure 5:
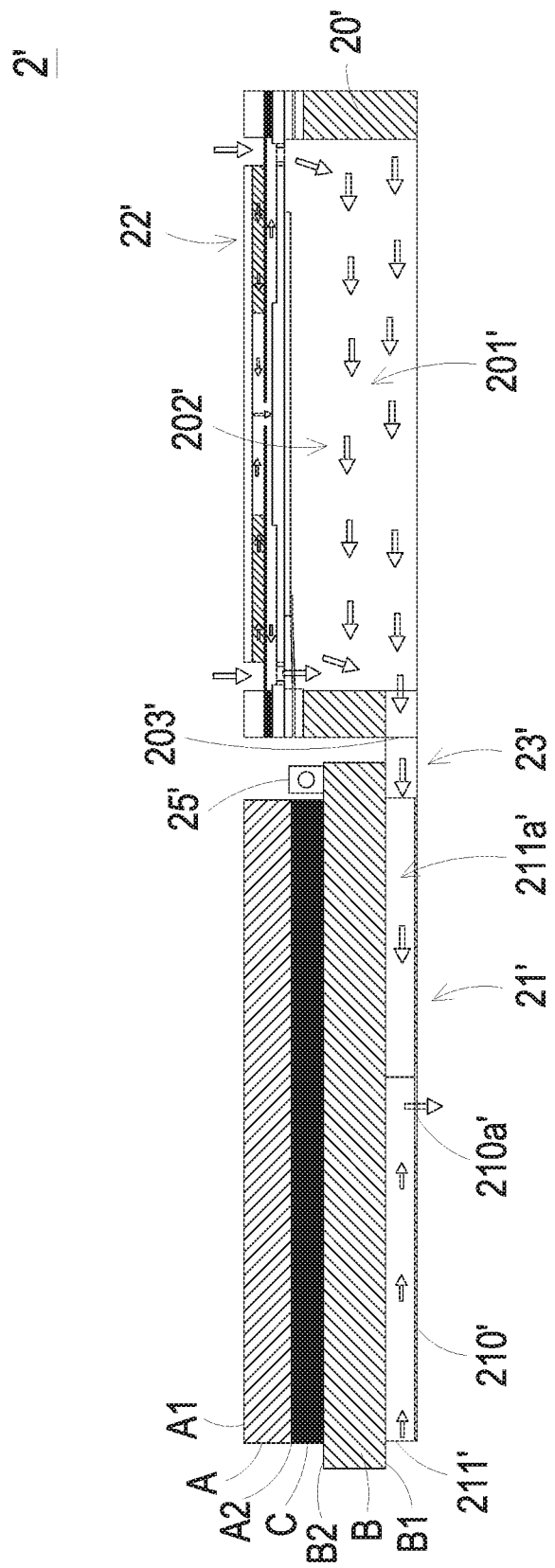
FIG. 5 is a schematic cross-sectional view illustrating the structure of an air-cooling heat dissipation device according to a second embodiment of the present invention.

FIG. 5 is a schematic cross-sectional view illustrating the structure of an air-cooling heat dissipation device according to a second embodiment of the present invention. In this embodiment, the air-cooling heat dissipation device 2' comprises a base 20', a swirling-airflow heatsink 21', an air pump 22' and a passage connector 23'. The base 20' is located beside the electronic component A. The base 20' comprises an introduction opening 202' and a discharge opening 203'. In an embodiment, the swirling-airflow heatsink 21' comprises a thermal conduction plate 210' and a conductive line 211'. The air pump 22' is fixed on the base 20'. Moreover, an airflow-guiding chamber 201' is defined by the air pump 22' and the base 20' collaboratively. The passage connector 23' is connected between the discharge opening 203' of the base 20' and the swirling passage 211a' of the swirling-airflow heatsink 21'.

According to the second embodiment, the structures of the base 20', the swirling-airflow heatsink 21', the air pump 22' and the passage connector 23' and the relationships between these components are similar to those of the first embodiment, so are not redundantly described herein. The main difference from the first embodiment is that the swirling-airflow heatsink 21' is attached on the thermal conduction element (e.g., the thermal conduction plate B), and the thermal conduction element is contacted with the electronic component A. As so, the electronic component A and the thermal conduction plate B are regarded collectively as a common heat source. The swirling-airflow heatsink 21' is attached on a first surface B1 of the thermal conduction plate B, while a second surface B2 of the thermal conduction plate B is attached on the second surface A2 of the electronic component A through a thermally conductive medium (e.g., a thermal adhesive C).

Although the swirling-airflow heatsink 21' is attached on the thermal conduction plate B in the second embodiment, the actions of components are similar to those of the first embodiment. When the air pump 22' is enabled, the ambient air outside the air-cooling heat dissipation device 2' is introduced into the airflow-guiding chamber 201' of the base 20' through the introduction opening 202'. The air is discharged to the passage connector 23' through the discharge opening 203'. Then, the air is introduced into the swirling passage 211a' of the swirling-airflow heatsink 21'. Consequently, a fast swirling air flow is produced to cool the thermal conduction plate B. Since the electronic component A is in thermal contact with the thermal conduction plate B, the heat from the electronic component A is transferred to the thermal conduction plate B and dissipated away by the fast swirling air flow. After being heated, the air flow is discharged to the surroundings of the air-cooling heat dissipation device 2' through the vent 210a' of the swirling-airflow heatsink 21'. Consequently, the purpose of dissipating the heat of the electronic component A and the thermal conduction plate B is achieved. From above-mentioned description, it can be seen that the swirling-airflow heatsink 21' is not restricted to be directly attached on the electronic component A itself. Instead, the swirling-airflow heatsink can be disposed on any object that is made of a material with high heat conductivity and is in contact with the electronic component A.

According to the second embodiment, a control system is provided. A temperature sensor 25' may be disposed on the thermal conduction plate B so as to detect the temperature of the thermal conduction plate B. The temperature sensor 25' transmits the detected temperature as a detecting signal to a control unit, so that the control unit can accordingly control the air pump 22'. Since the control system is similar to that of the above embodiment, it is not redundantly described in detail herein.

Figure 6A:
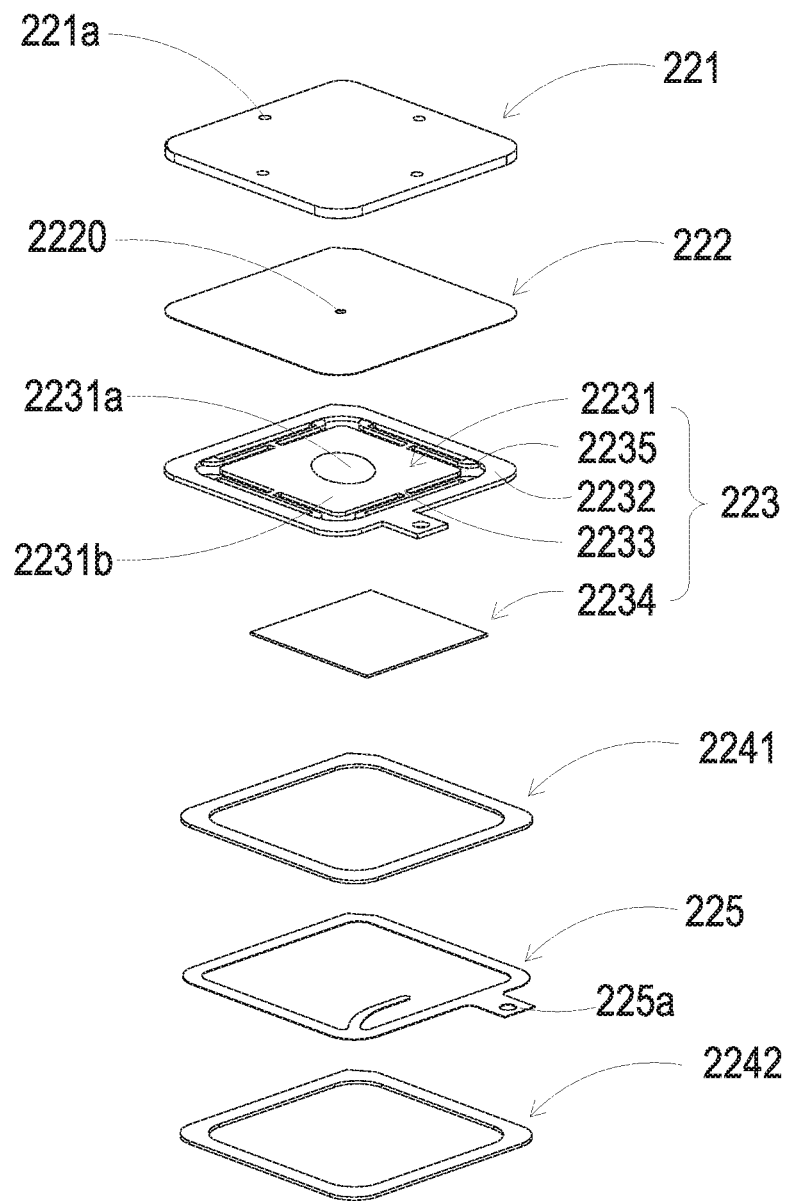
FIG. 6A is a schematic exploded view illustrating an air pump used in the air-cooling heat dissipation device of the present invention.
Figure 6B:
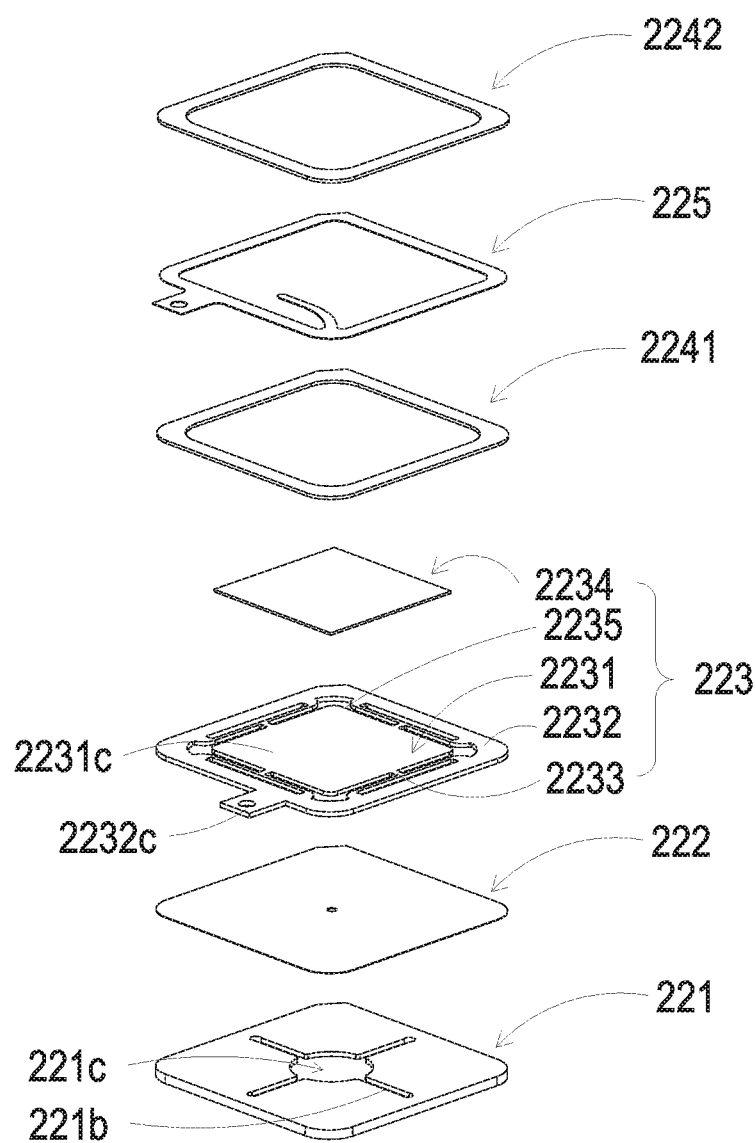
FIG. 6B is a schematic exploded view illustrating the air pump of FIG. 6A and taken along another viewpoint.
Figure 7:
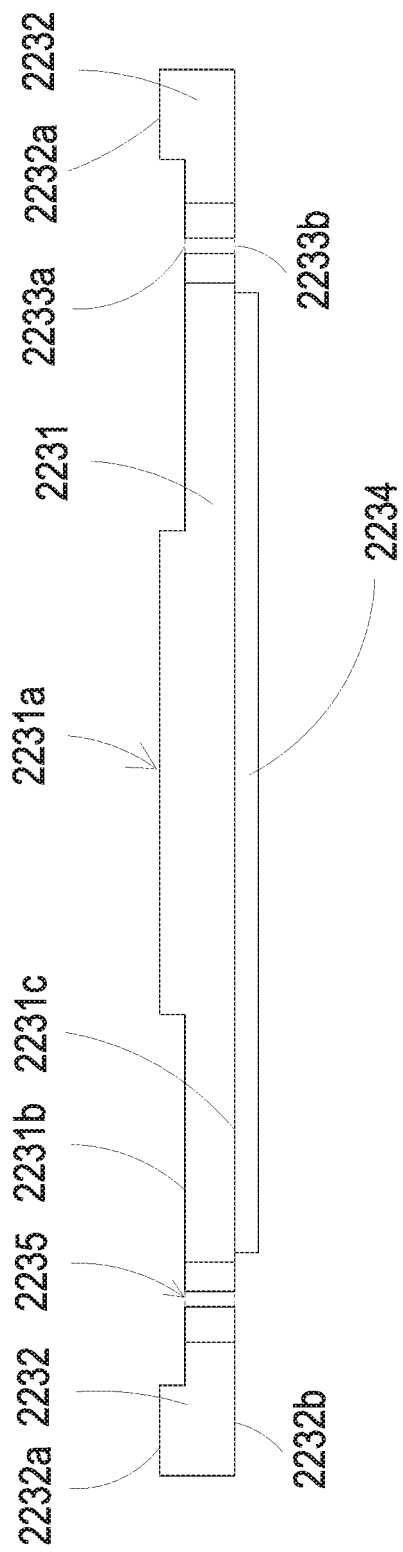
FIG. 7 is a schematic cross-sectional view illustrating a piezoelectric actuator of the air pump as shown in FIGS. 6A and 6B.

FIG. 6A is a schematic exploded view illustrating an air pump used in the air-cooling heat dissipation device according to an embodiment of the present invention. FIG. 6B is a schematic exploded view illustrating the air pump of FIG. 6A and taken along another viewpoint. FIG. 7 is a schematic cross-sectional view illustrating a piezoelectric actuator of the air pump as shown in FIGS. 6A and 6B. FIG. 8 is a schematic cross-sectional view illustrating the air pump as shown in FIGS. 6A and 6B. Please refer to FIGS. 6A, 6B, 7 and 8. According to an embodiment of the present invention, the air pump 22 is a piezoelectric air pump, comprising a gas inlet plate 221, a resonance plate 222, a piezoelectric actuator 223, a first insulation plate 2241, a conducting plate 225 and a second insulation plate 2242, which are stacked on each other sequentially. The piezoelectric actuator 223 is aligned with the resonance plate 222. After the above components are combined together, the cross-sectional view of the resulting structure of the air pump 22 is shown in FIG. 8.

The gas inlet plate 221 comprises at least one inlet 221a. Preferably but not exclusively, the gas inlet plate 221 comprises four inlets 221a. The inlets 221a run through the gas inlet plate 221. In response to the action of the atmospheric pressure, the air is introduced into the air pump 22 through the inlets 221a. Moreover, at least one convergence channel 221b is formed on a first surface of the gas inlet plate 221, and is in communication with the at least one inlet 221a on a second surface of the gas inlet plate 22. Moreover, a central cavity 221c is located at the intersection of the four convergence channels 221b. The central cavity 221c is in communication with the at least one convergence channel 221b, such that the gas entered by the inlets 221a would be introduced into the at least one convergence channel 221b and is guided to the central cavity 221c. Consequently, the air can be transferred by the air pump 22. In this embodiment, the at least one inlet 221a, the at least one convergence channel 221b and the central cavity 221c of the gas inlet plate 221 are integrally formed. The central cavity 221c is a convergence chamber for temporarily storing the air. Preferably but not exclusively, the gas inlet plate 221 is made of stainless steel. In some embodiments, the depth of the convergence chamber defined by the central cavity 221c is equal to the depth of the at least one convergence channel 221b. The resonance plate 222 is made of a flexible material, which is preferably but not exclusively copper. The resonance plate 222 further has a central aperture 2220 corresponding to the central cavity 221c of the gas inlet plate 221 that providing the gas for flowing through.

The piezoelectric actuator 223 comprises a suspension plate 2231, an outer frame 2232, at least one bracket 2233 and a piezoelectric plate 2234. The piezoelectric plate 2234 is attached on a first surface 2231c of the suspension plate 2231. In response to an applied voltage, the piezoelectric plate 2234 would be subjected to a deformation. When the piezoelectric plate 2233 is subjected to the deformation, the suspension plate 2231 is subjected to a curvy vibration. The at least one bracket 2233 is connected between the suspension plate 2231 and the outer frame 2232, while the two ends of the bracket 2233 are connected with the outer frame 2232 and the suspension plate 2231 respectively that the bracket 2233 can elastically support the suspension plate 2231. At least one vacant space 2235 is formed between the bracket 2233, the suspension plate 2231 and the outer frame 2232. The at least one vacant space 2235 is in communication with the introduction opening 202 for allowing the air to go through. The type of the suspension plate 2231 and the outer frame 2232, and the type and the number of the at least one bracket 2233 may be varied according to the practical requirements. The outer frame 2232 is arranged around the suspension plate 2231. Moreover, a conducting pin 2232c is protruding outwardly from the outer frame 2232 so as to be electrically connected with an external circuit (not shown).

As shown in FIG. 7, the suspension plate 2231 has a bulge 2231a that makes the suspension plate 2231 a stepped structure. The bulge 2231a is formed on a second surface 2231b of the suspension plate 2231. The bulge 2231b may be a circular convex structure. A top surface of the bulge 2231a of the suspension plate 2231 is coplanar with a second surface 2232a of the outer frame 2232, while the second surface 2231b of the suspension plate 2231 is coplanar with a second surface 2233a of the bracket 2233. Moreover, there is a drop of specified amount from the bulge 2231a of the suspension plate 2231 (or the second surface 2232a of the outer frame 2232) to the second surface 2231b of the suspension plate 2231 (or the second surface 2233a of the bracket 2233). A first surface 2231c of the suspension plate 2231, a first surface 2232b of the outer frame 2232 and a first surface 2233b of the bracket 2233 are coplanar with each other. The piezoelectric plate 2234 is attached on the first surface 2231c of the suspension plate 2231. The suspension plate 2231 may be a square plate structure with two flat surfaces but the type of the suspension plate 2231 may be varied according to the practical requirements. In this embodiment, the suspension plate 2231, the at least bracket 2233 and the outer frame 2232 are integrally formed and produced by using a metal plate (e.g., a stainless steel plate). In an embodiment, the length of the piezoelectric plate 2234 is smaller than the length of the suspension plate 2231. In another embodiment, the length of the piezoelectric plate 2234 is equal to the length of the suspension plate 2231. Similarly, the piezoelectric plate 2234 is a square plate structure corresponding to the suspension plate 2231.

In the air pump 22, the first insulation plate 2241, the conducting plate 225 and the second insulation plate 2242 are stacked on each other sequentially and located under the piezoelectric actuator 223. The profiles of the first insulation plate 2241, the conducting plate 225 and the second insulation plate 2242 substantially match the profile of the outer frame 2232 of the piezoelectric actuator 223. The first insulation plate 2241 and the second insulation plate 2242 are made of an insulating material (e.g. a plastic material) for providing insulating efficacy. The conducting plate 225 is made of an electrically conductive material (e.g. a metallic material) for providing electrically conducting efficacy. Moreover, the conducting plate 225 has a conducting pin 225a so as to be electrically connected with an external circuit (not shown).

In an embodiment, the gas inlet plate 221, the resonance plate 222, the piezoelectric actuator 223, the first insulation plate 2241, the conducting plate 225 and the second insulation plate 2242 of the air pump 22 are stacked on each other sequentially. Moreover, there is a gap h between the resonance plate 222 and the outer frame 2232 of the piezoelectric actuator 223, which is formed and maintained by a filler (e.g. a conductive adhesive) inserted therein in this embodiment. The gap h ensures the proper distance between the bulge 2231a of the suspension plate 2231 and the resonance plate 222, so that the contact interference is reduced and the generated noise is largely reduced. In some embodiments, the height of the outer frame 2232 of the piezoelectric actuator 223 is increased, so that the gap is formed between the resonance plate 222 and the piezoelectric actuator 223.

After the gas inlet plate 221, the resonance plate 222 and the piezoelectric actuator 223 are combined together, a movable part 222a and a fixed part 222b of the resonance plate 222 are defined. A convergence chamber for converging the air is defined by the movable part 222a of the resonance plate 222 and the gas inlet plate 211 collaboratively. Moreover, a first chamber 220 is formed between the resonance plate 222 and the piezoelectric actuator 223 for temporarily storing the air. Through the central aperture 2220 of the resonance plate 222, the first chamber 220 is in communication with the central cavity 221c of the gas inlet plate 221. The peripheral regions of the first chamber 220 are in communication with the underlying introduction opening 202 through the vacant space 2235 between the brackets 2233 of the piezoelectric actuator 223.

FIGS. 9A to 9E schematically illustrate the actions of the air pump of FIGS. 6A and 6B. Please refer to FIGS. 8 and 9A to 9E. The actions of the air pump will be described as follows. When the air pump 22 is enabled, the piezoelectric actuator 223 is vibrated along a vertical direction in a reciprocating manner by using the bracket 2233 as the fulcrums. The resonance plate 222 except for the part of it fixed on the gas inlet plate 221 is hereinafter referred as a movable part 222a, while the rest is referred as a fixed part 222b. Since the resonance plate 222 is light and thin, the movable part 222a vibrates along with the piezoelectric actuator 223 because of the resonance of the piezoelectric actuator 223. In other words, the movable part 222a is reciprocated and subjected to a curvy deformation. When the piezoelectric actuator 223 is vibrated downwardly, the movable part 222a of the resonance plate 222 is subjected to the curvy deformation because the movable part 222a of the resonance plate 222 is pushed by the air and vibrated in response to the piezoelectric actuator 223. In response to the downward vibration of the piezoelectric actuator 223, the air is fed into the at least one inlet 221a of the gas inlet plate 221. Then, the air is transferred to the central cavity 221c of the gas inlet plate 221 through the at least one convergence channel 221b. Then, the air is transferred through the central aperture 2220 of the resonance plate 222 corresponding to the central cavity 221c, and introduced downwardly into the first chamber 220. As the piezoelectric actuator 223 is enabled, the resonance of the resonance plate 222 occurs. Consequently, the resonance plate 222 is also vibrated along the vertical direction in the reciprocating manner.

As shown in FIG. 9B, during the vibration of the movable part 222a of the resonance plate 222, the movable part 222a moves down till bring contacted with the bulge 2231a of the suspension plate 2231. In the meantime, the volume of the first chamber 220 is shrunken and a middle space which was communicating with the convergence chamber is closed. Under this circumstance, the pressure gradient occurs to push the air in the first chamber 121 moving toward peripheral regions of the first chamber 220 and flowing downwardly through the vacant spaces 2235 of the piezoelectric actuator 223.

Please refer to FIG. 9C, which illustrates consecutive action following the action in FIG. 9B. The movable part 222a of the resonance plate 222 has returned its original position when, the piezoelectric actuator 223 has ascended at a vibration displacement to an upward position. Consequently, the volume of the first chamber 220 is consecutively shrunken that generating the pressure gradient which makes the air in the first chamber 220 continuously pushed toward peripheral regions. Meanwhile, the air continuously fed into the inlets 221a of the gas inlet plate 221 and transferred to the central cavity 221c.

Figure 9D:
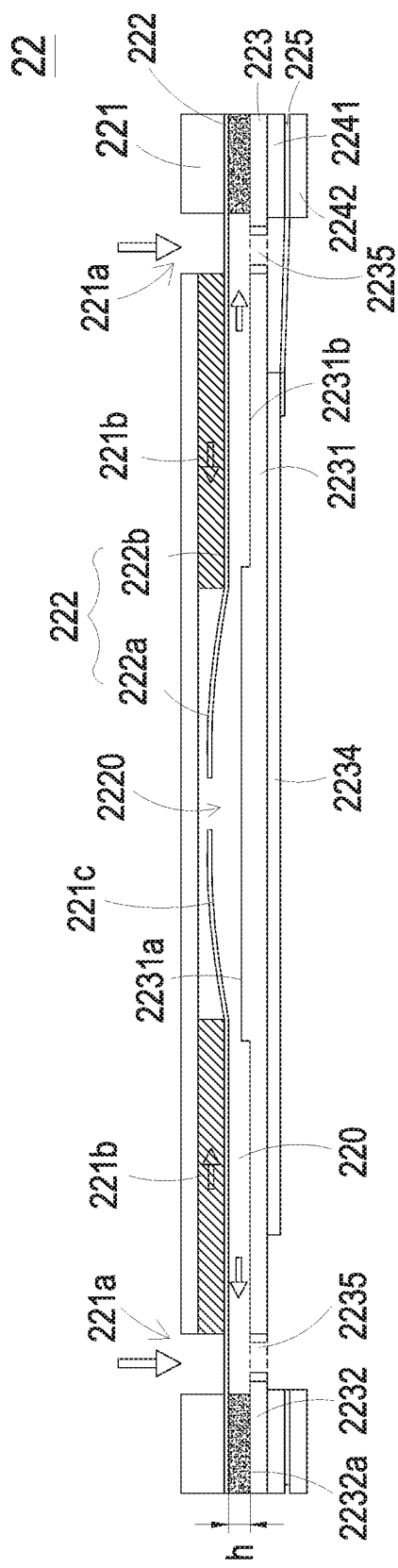

Then, as shown in FIG. 9D, the resonance plate 222 moves upwardly, which is caused by the resonance of the upward motion of the piezoelectric actuator 223. Consequently, the air is slowly fed into the inlets 221a of the gas inlet plate 221, and transferred to the central cavity 221c.

Figure 9E:
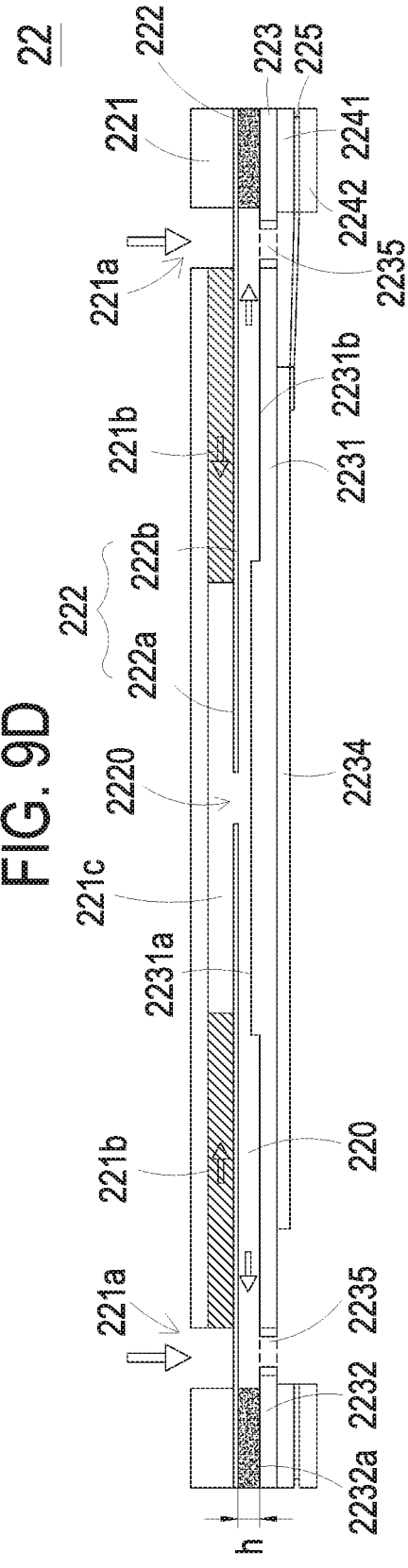

As shown in FIG. 9E, the movable part 222a of the resonance plate 222 has returned its original position. When the resonance plate 222 is vibrated along the vertical direction in the reciprocating manner, the gap h between the resonance plate 222 and the piezoelectric actuator 223 providing space for vibration of the resonance plate 222. That is, the thickness of the gap h affects the amplitude of vibration of the resonance plate 12. Consequently, a pressure gradient is generated in the fluid channels of the air pump 22 to facilitate the air to flow at a high speed. Moreover, since there is an impedance difference between the feeding direction and the exiting direction, the air can be transmitted from the inlet side to the outlet side. Moreover, even if the outlet side has a gas pressure, the air pump 22 still has the capability of pushing the air to the first airflow-guiding chamber 200 while achieving the silent efficacy.

The steps of FIGS. 9A to 9E are repeatedly done. Consequently, the ambient air is transferred by the air pump 22 from the outside to the inside.

As mentioned above, the operation of the air pump 22 can guide the air into the airflow-guiding chamber 201 of the base 20 and discharge the air to the passage connector 23 through the discharge opening 203. Then, the air is introduced into the swirling passage 211a of the swirling-airflow heatsink 21. Consequently, a fast swirling airflow is produced to cool a heat source such as the electronic component A or the thermal conduction plate B. After being heated, the heated airflow is discharged to the surroundings of the air-cooling heat dissipation device 2 through the vent 210a of the swirling-airflow heatsink 21. Consequently, the cooling efficiency is enhanced, and the performance stability and the life span of the electronic component A are increased.

Figure 10:
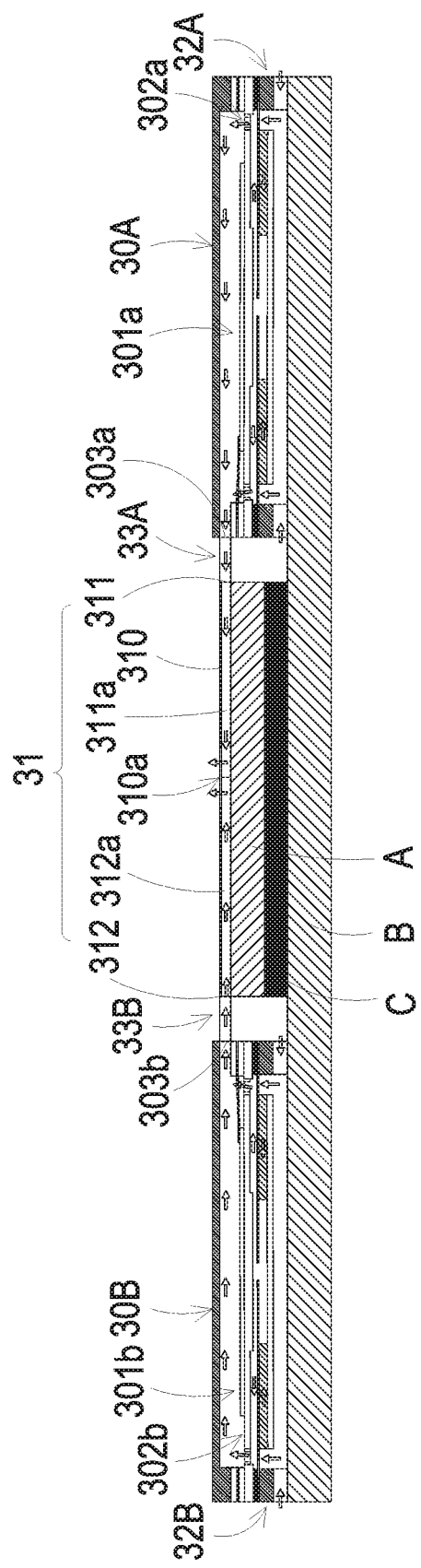
FIG. 10 is a schematic cross-sectional view illustrating the structure of an air-cooling heat dissipation device according to a third embodiment of the present invention.
Figure 11:
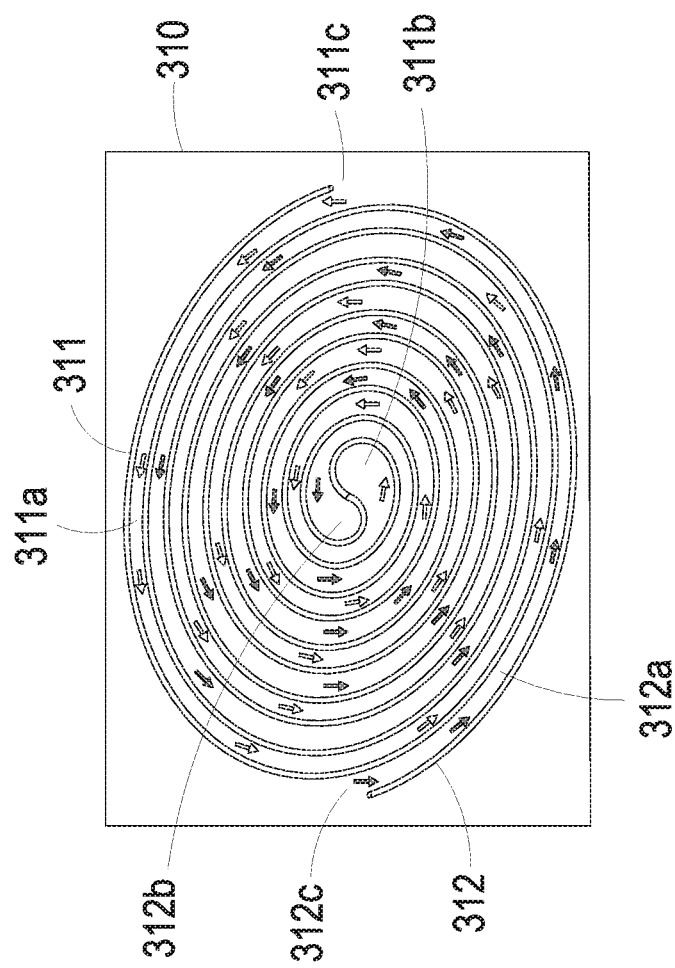
FIG. 11 is a schematic view illustrating a portion of the swirling-airflow heatsink of the air-cooling heat dissipation device according to the third embodiment of the present invention.

Please refer to FIG. 10 and FIG. 11. FIG. 10 is a schematic cross-sectional view illustrating the structure of an air-cooling heat dissipation device according to a third embodiment of the present invention. FIG. 11 is a schematic view illustrating a portion of the swirling-airflow heatsink of the air-cooling heat dissipation device according to the third embodiment of the present invention. As shown in FIG. 10, the air-cooling heat dissipation device 3 comprises two bases 30A and 30B, a swirling-airflow heatsink 31, two air pumps 32A and 32B, and two passage connectors 33A and 33B, wherein the swirling-airflow heatsink 31 is attached on the electronic component A. The bases 30A and 30B, the air pumps 32A and 32B, and the passage connectors 33A and 33B are respectively assembled to become each of a pair of air input assemblies, while the two air input assemblies are disposed on two opposite sides of the swirling-airflow heatsink 31. The structure and the way of acting of those components are identical with those of the first embodiments, so are not redundantly described herein.

As shown in FIG. 11, the swirling-airflow heatsink 31 comprises a thermal conduction plate 310, and two conductive lines 311 and 312. The conductive lines 311 and 312 are curved in the swirl shape and fixed on the thermal conduction plate 310, which forms a dual-swirling passage composed of two swirling passages 311a and 312a. The swirling passage 311a has an input part 311c and a middle region 311b, and the swirling passage 312a has an input part 312c and a middle region 312b. The thermal conduction plate 310 has a vent 310a (not shown in FIG. 11, see FIG. 10) in the center, and the middle region 311b and 312b are aligned with the vent 310a.

Please refer to FIG. 10 again. The air pumps 32A and 32B are fixed on the bases 30A and 30B respectively, sealing the edge of the introduction opening 302a of the base 30A and the introduction opening 302b of the base 30B. Hence, an airflow-guiding chamber 301a is defined by the air pump 32A and the base 30A collaboratively, and an airflow-guiding chamber 301b is defined by the air pump 32B and the base 30B collaboratively. The passage connector 33A is connected between the discharge opening 303a of the base 30A and the swirling passage 311a of the dual-swirling passage in the swirling-airflow heatsink 31. Similarly, the passage connector 33B is connected between the discharge opening 303b of the base 30B and the swirling passage 312a of the dual-swirling passage in the swirling-airflow heatsink 31. When the air pumps 32A and 32B are enabled, ambient air is introduced into the airflow-guiding chamber 301a of the base 30A and the airflow-guiding chamber 301b of the base 30B, then being discharged to the passage connectors 33A and 33B through the discharge openings 303a and 303b respectively. The passage connectors 33A and 33B carry the air flow to the swirling passages 311a and 312a respectively, consequently forming a fast dual-swirling air flow to cool the electronic component A. Afterwards, the heated dual-swirling air flow is discharged to the surroundings of the air-cooling heat dissipation device 3 through the vent 310a of the swirling-airflow heatsink 31. Since there are two air input assemblies and the heat sink 31 has the dual-swirl passages, the efficiency of heat dissipation is further enhanced in this embodiment.

Figure 12:
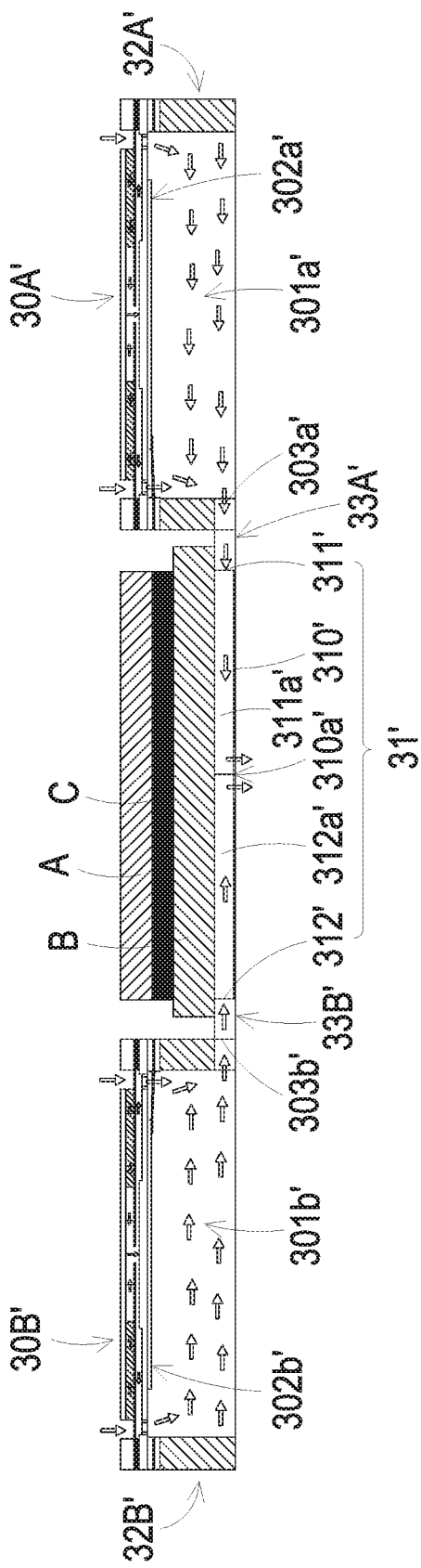
FIG. 12 is a schematic cross-sectional view illustrating the structure of an air-cooling heat dissipation device according to a fourth embodiment of the present invention.

FIG. 12 is a schematic cross-sectional view illustrating the structure of an air-cooling heat dissipation device according to a fourth embodiment of the present invention. As shown in FIG. 12, the air-cooling heat dissipation device 3' comprises two bases 30A' and 30B', a swirling-airflow heatsink 31', two air pumps 32A' and 32B', and two passage connectors 33A' and 33B'. The two bases 30A' and 30B' are located at two opposite sides of the electronic component A. The base 30A' comprises an introduction opening 302a' and a discharge opening 303a'. The base 30B' comprises an introduction opening 302b' and a discharge opening 303b'. The swirling-airflow heatsink 31' comprises a thermal conduction plate 310' and the two conductive lines 311' and 312'. The thermal conduction plate 310' is placed over the conductive lines 311' and 312' to cover the conductive lines 311' and 312'. Consequently, a dual-swirling passage with two swirling passages 311a' and 312a' is defined. The air pumps 32A' and 32B' are fixed on the bases 30A' and 30B' respectively. Moreover, an airflow-guiding chamber 301a' is defined by the air pump 32A' and the base 30A' collaboratively, and an airflow-guiding chamber 301b' is defined by the air pump 32B' and the base 30B' collaboratively. The passage connector 33A' is connected between the discharge opening 303a' of the base 30A' and the swirling passage 311a' of the swirling-airflow heatsink 31'. The passage connector 33B' is connected between the discharge opening 303b' of the base 30B' and the swirling passage 312a' of the swirling-airflow heatsink 31'. The structure of each component of the bases 30A and 30B, the swirling-airflow heatsink 31', the air pumps 32A' and 32b' and the passage connectors 33A' and 33b', and the relationships between these components are similar to those of the above embodiment. In this embodiment, the swirling-airflow heatsink 31' is attached on the thermal conduction element (e.g., the thermal conduction plate B), which is contacted with the electronic component A. The swirling-airflow heatsink 31' is not directly attached on the electronic component A. The electronic component A and the thermal conduction plate B are collectively regarded as a common heat source. The swirling-airflow heatsink 31' is attached on the thermal conduction plate B to remove the heat.

When the air pumps 32A' and 32B' are enabled, the air is driven by the air pumps 32A' and 32B' and introduced into the airflow-guiding chamber 301a' of the base 30A' and the airflow-guiding chamber 301b' of the base 30B' through the introduction opening 302a' and 302b'. The air is discharged to the passage connectors 33A' and 33B' through the discharge openings 303a' and 303b', respectively. Then, the air is introduced into the dual-swirling passage with the two swirling passages 311a' and 312a'. Consequently, a fast dual-swirling airflow is produced to cool the thermal conduction plate B. Since the electronic component A is in thermal contact with the thermal conduction plate B, the heat from the electronic component A is transferred to the thermal conduction plate B and dissipated away by the fast dual-swirling airflow. After being heated, the heated airflow is discharged to the surroundings of the air-cooling heat dissipation device 3' through the vent 310a' of the swirling-airflow heatsink 31'. Consequently, the purpose of dissipating the heat of the electronic component A and the thermal conduction plate B will be achieved.

As mentioned above, the air-cooling heat dissipation device comprises the base, the swirling-airflow heatsink, the air pump and the passage connector. When the air pump is enabled, the air flow is driven by the air pump and transferred to the swirling-airflow heatsink through the base and the passage connector. Consequently, a fast swirling airflow is produced to cool the heat source via forced convection. The number of the air pumps and the position, shape or size of the swirling-airflow heatsink may be varied according to the practical requirements. Moreover, a temperature sensor is located near or directly attached on the heat source to detect the temperature of the heat source, and the detecting signal from the temperature sensor is continuously transmitted to the control unit. According to the detecting signal, the control system controls the air pump to cool the electronic component within the electronic device.

From the above descriptions, the present invention provides an air-cooling heat dissipation device with compact size that is suitable to be applied to a wide variety of portable electronic devices to remove heat generated by electronic components thereof as well as keeping the electronic devices in slim profile. Moreover, the heat is dissipated away more efficiently and the noise during operation is reduced in comparison of the conventional techniques.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air-cooling heat dissipation device for removing heat from an electronic component, the air-cooling heat dissipation device comprising:
   a base located beside the electronic component, and comprising an introduction opening and a discharge opening;
   a swirling-airflow heatsink attached on the electronic component, and comprising a swirl-shaped conductive line and a thermal conduction plate placed over the conductive line, so that a swirling passage is defined by the conductive line and the thermal conduction plate collaboratively, wherein the thermal conduction plate has a vent corresponding to a middle region of the swirling passage;
   an air pump fixed on the base and sealing the edge of the introduction opening by which an airflow-guiding chamber is defined by the air pump and the base collaboratively; and
   a passage connector connected between the discharge opening of the base and the swirling passage of the swirling-airflow heatsink,
   wherein when the air pump is enabled, an ambient air is driven by the air pump and introduced into the airflow-guiding chamber of the base and transferred to the swirling passage of the swirling-airflow heatsink through the discharge opening and the passage connector, so that a fast swirling air flow is produced to remove heat from the electronic component, after which the heated air flow is discharged through the vent of the swirling-airflow heatsink.

2. The air-cooling heat dissipation device according to claim 1, wherein the air pump is a piezoelectric air pump.

3. The air-cooling heat dissipation device according to claim 2, wherein the piezoelectric air pump comprises:
   a gas inlet plate comprising at least one inlet, at least one convergence channel and a central cavity, wherein a convergence chamber is defined by the central cavity, and the at least one convergence channel corresponds to the at least one inlet, wherein after the air is introduced into the at least one convergence channel through the at least one inlet, the air is guided by the at least one convergence channel and converged to the convergence chamber;
   a resonance plate having a central aperture, wherein the central aperture is aligned with the convergence chamber, wherein the resonance plate comprises a movable part near the central aperture; and
   a piezoelectric actuator aligned with the resonance plate, wherein a gap is formed between the resonance plate and the piezoelectric actuator to define a first chamber, wherein when the piezoelectric actuator is enabled, the air is fed into the air pump through the at least one inlet of the gas inlet plate, converged to the central cavity through the at least one convergence channel, transferred through the central aperture of the resonance plate, and introduced into the first chamber, wherein the air is further transferred through a resonance between the piezoelectric actuator and the movable part of the resonance plate.

4. The air-cooling heat dissipation device according to claim 3, wherein the piezoelectric air pump comprises a conducting plate, a first insulation plate and a second insulation plate, wherein the gas inlet plate, the resonance plate, the first insulation plate, the conducting plate and the second insulation plate are stacked on each other sequentially.

5. The air-cooling heat dissipation device according to claim 3, wherein the piezoelectric actuator comprises:
   a suspension plate having a first surface and an opposing second surface, wherein the suspension plate is permitted to undergo a curvy vibration;
   an outer frame arranged around the suspension plate;
   at least one bracket connected between the suspension plate and the outer frame for elastically supporting the suspension plate; and
   a piezoelectric plate, wherein a length of the piezoelectric plate is smaller than or equal to a length of the suspension plate, and the piezoelectric plate is attached on the first surface of the suspension plate, wherein when a voltage is applied to the piezoelectric plate, the suspension plate is driven to undergo the curvy vibration.

6. The air-cooling heat dissipation device according to claim 5, wherein the suspension plate is a square suspension plate having a bulge formed on the second surface.

7. The air-cooling heat dissipation device according to claim 1, further comprising a control system, wherein the control system comprises:
   a control unit electrically connected with the air pump for controlling operations of the air pump; and
   a temperature sensor electrically connected with the control unit and located near the electronic component, wherein the temperature sensor detects a temperature of the electronic component and generates a corresponding detecting signal to the control unit,
   wherein the control unit obtains the temperature of the electronic component according to the detecting signal, wherein if the control unit determines the temperature of the electronic component is higher than or equal to a threshold value, the control unit enables the air pump to generate the air flow, wherein if the control unit determines that the temperature of the electronic component is lower than the threshold value, the control unit disables the air pump.

8. An air-cooling heat dissipation device for removing heat from an electronic component, the electronic component being contacted with a thermal conduction element, the air-cooling heat dissipation device comprising:
   a base located beside the electronic component, and comprising an introduction opening and a discharge opening;
   a swirling-airflow heatsink attached on the thermal conduction element, and comprising a swirl-shaped conductive line and a thermal conduction plate placed over the conductive line, so that a swirling passage is defined by the conductive line and the thermal conduction base collaboratively, wherein the thermal conduction plate has a vent corresponding to a middle region of the swirling passage;
   an air pump fixed on the base and sealing the edge of the introduction opening by which an airflow-guiding chamber is defined by the air pump and the base collaboratively; and
   a passage connector connected between the discharge opening of the base and the swirling passage of the swirling-airflow heatsink,
   wherein when the air pump is enabled, an ambient air is driven by the air pump and introduced into the airflow-guiding chamber of the base and transferred to the swirling passage of the swirling-airflow heatsink through the discharge opening and the passage connector, so that a fast swirling air flow is produced, wherein the heat from the electronic component is transferred to the thermal conduction element and removed by the fast swirling air flow, after which the heated air flow is discharged through the vent of the swirling-airflow heatsink.

9. An air-cooling heat dissipation device for removing heat from an electronic component, the air-cooling heat dissipation device comprising:
   a first base and a second base opposed to each other with respect to the electronic component, wherein the first base comprises a first introduction opening and a first discharge opening, and the second base comprises a second introduction opening and a second discharge opening;
   a swirling-airflow heatsink attached on the electronic component, and comprising a first swirl-shaped conductive line, a second swirl-shaped conductive line and a thermal conduction plate placed over the first swirl-shaped conductive line and the second swirl-shaped conductive line, so that a dual-swirling passage is defined by the first swirl-shaped conductive line, the second swirl-shaped conductive line and the thermal conduction plate collaboratively, wherein the thermal conduction plate has a vent corresponding to a middle region of the dual-swirling passage;
   a first air pump fixed on the first base and sealing the edge of the first introduction opening by which a first airflow-guiding chamber is defined by the first air pump and the first base collaboratively;
   a second air pump fixed on the second base and sealing the edge of the second introduction opening by which a second airflow-guiding chamber is defined by the second air pump and the second base collaboratively;
   a first passage connector connected between the first discharge opening of the first base and the dual-swirling passage of the swirling-airflow heatsink; and
   a second passage connector connected between the second discharge opening of the second base and the dual-swirling passage of the swirling-airflow heatsink,
   wherein when the first air pump and the second air pump are enabled, an ambient air is driven by the first air pump and the second air pump and introduced into the first airflow-guiding chamber of the first base and the second airflow-guiding chamber of the second base and transferred to the dual-swirling passage of the swirling-airflow heatsink through the first discharge opening, the first passage connector, the second discharge opening and the second passage connector, so that a fast dual-swirling air flow is produced to remove heat generated by the electronic component, after which the heated air flow is discharged through the vent of the swirling-airflow heatsink.

10. An air-cooling heat dissipation device for removing heat from an electronic component, the electronic component being contacted with a thermal conduction element, the air-cooling heat dissipation device comprising:
   a first base and a second base opposed to each other with respect to the electronic component, wherein the first base comprises a first introduction opening and a first discharge opening, and the second base comprises a second introduction opening and a second discharge opening;
   a swirling-airflow heatsink attached on the thermal conduction element, and comprising a first swirl-shaped conductive line, a second swirl-shaped conductive line and a thermal conduction plate, wherein the first swirl-shaped conductive line and the second swirl-shaped conductive line are attached on the thermal conduction element, and the thermal conduction plate is placed over the first swirl-shaped conductive line and the second swirl-shaped conductive line, so that a dual-swirling passage is defined by the first swirl-shaped conductive line, the second swirl-shaped conductive line and the thermal conduction plate collaboratively, wherein the thermal conduction plate has a vent corresponding to a middle region of the dual-swirling passage;

a first air pump fixed on the first base and sealing the edge of the first introduction opening by which a first airflow-guiding chamber is defined by the first air pump and the first base collaboratively;

a second air pump fixed on the second base and sealing the edge of the second introduction opening by which a second airflow-guiding chamber is defined by the second air pump and the second base collaboratively;

a first passage connector connected between the first discharge opening of the first base and the dual-swirling passage of the swirling-airflow heatsink; and a second passage connector connected between the second discharge opening of the second base and the dual-swirling passage of the swirling-airflow heatsink, wherein when the first air pump and the second air pump are enabled, an ambient air is driven by the first air pump and the second air pump and introduced into the first airflow-guiding chamber of the first base and the second airflow-guiding chamber of the second base and transferred to the dual-swirling passage of the swirling-airflow heatsink through the first discharge opening the first passage connector, the second discharge opening and the second passage connector, so that a fast dual-swirling air flow is produced, wherein the heat from the electronic component is transferred to the thermal conduction element and removed by the fast dual-swirling air flow, after which the heated air flow is discharged through the vent of the swirling-airflow heatsink.

* * * * *